(12) United States Patent
Hamerski

(10) Patent No.: US 8,426,971 B2
(45) Date of Patent: Apr. 23, 2013

(54) TOP TRI-METAL SYSTEM FOR SILICON POWER SEMICONDUCTOR DEVICES

(75) Inventor: Roman Hamerski, Overland Park, KS (US)

(73) Assignee: Diodes FabTech, Inc., Lee's Summit, MO (US)

( * ) Notice: Subject to any disclaimer, the term of this patent is extended or adjusted under 35 U.S.C. 154(b) by 142 days.

(21) Appl. No.: 12/869,940

(22) Filed: Aug. 27, 2010

(65) Prior Publication Data

US 2012/0049372 A1    Mar. 1, 2012

(51) Int. Cl.
- H01L 23/48 (2006.01)
- H01L 23/52 (2006.01)
- H01L 29/40 (2006.01)

(52) U.S. Cl.
USPC .......... 257/763; 257/764; 257/766; 257/769; 257/770; 257/E23.154

(58) Field of Classification Search .................. 257/763, 257/764, 766, 769, 770, E23.154
See application file for complete search history.

(56) References Cited

U.S. PATENT DOCUMENTS

| | | | | |
|---|---|---|---|---|
| 4,176,443 A | * | 12/1979 | Iannuzzi et al. | 438/106 |
| 4,408,216 A | * | 10/1983 | Gould | 257/486 |
| 4,840,302 A | * | 6/1989 | Gardner et al. | 228/123.1 |
| 6,570,251 B1 | * | 5/2003 | Akram et al. | 257/738 |
| 6,614,117 B1 | * | 9/2003 | Tiku et al. | 257/753 |
| 7,045,903 B2 | | 5/2006 | Efland | |
| 7,508,077 B2 | * | 3/2009 | Watanabe et al. | 257/763 |
| 2002/0096764 A1 | * | 7/2002 | Huang | 257/737 |
| 2003/0107137 A1 | * | 6/2003 | Stierman et al. | 257/763 |
| 2003/0214037 A1 | * | 11/2003 | Tellkamp | 257/738 |
| 2007/0257372 A1 | * | 11/2007 | Tada et al. | 257/763 |

* cited by examiner

*Primary Examiner* — Teresa M Arroyo
(74) *Attorney, Agent, or Firm* — Yingsheng Tung

(57) ABSTRACT

A titanium-nickel-palladium solderable metal system for silicon power semiconductor devices (10), which may be used for one or both of the anode (20) or cathode (30). The metal system includes an outer layer of palladium (40,70), an intermediate layer of nickel (50,80), and an inner layer of titanium (60,90). For certain applications, the nickel may be alloyed with vanadium. The metal system may be deposited on bare silicon (100) or on one or more additional layers of metal (110) which may include aluminum, aluminum having approximately 1% silicon, or metal silicide. The use of palladium, rather than gold or silver, reduces cost, corrosion, and scratching.

9 Claims, 2 Drawing Sheets

TOP TRI-METAL SYSTEM FOR SILICON POWER SEMICONDUCTOR DEVICES

FIELD OF THE INVENTION

The present invention relates broadly to top metal systems for power semiconductor devices. More specifically, the present invention concerns titanium-nickel-palladium top metal systems for silicon power semiconductor devices.

BACKGROUND

Discrete (non-integrated) power semiconductor devices are often built using a vertical structure in which electrical current passes through the thickness of the chip between the front and back surfaces of the device. The front surface of such devices presents an anode or "front metal," the back surface presents a cathode or "back metal," and each electrode takes the form of a metal pad comprising several layers of metal. Alternatively, the front surface presents the cathode, and the back surface presents the anode. Because these metal layers are deposited on top of any other layers, both front metal and back metal are often referred to herein as "top metal." Some devices present more than one electrode on one or both sides. For example, bipolar transistors (BJTs) and power MOSFETs are three-terminal devices that present two electrodes, such as an emitter and a base (in the case of BJTs) or a source and a gate (in the case of MOSFETs), on their front surfaces.

Titanium-nickel-gold and titanium-nickel-silver top metal systems are used in the silicon power semiconductor industry to mount chips using high temperature soldering. Unfortunately, both systems suffer from significant disadvantages: the former from the increasing cost of gold, and the latter from the strong tendency of silver to tarnish even when a great deal of care is taken in transport and storage. Furthermore, both systems, when used as top layers, are prone to scratching due to their low hardness (both are between 2.5 and 3 on the Mohs scale), which can result in the costly rejection of wafers. Additionally, where the electrodes are exposed to multiple iterations of the soldering cycle, gold will interact with and allow the nickel to migrate to the outer surface of the metal system where it may corrode and compromise the soldered connection.

SUMMARY OF THE INVENTION

The present invention provides a metal system for power semiconductor devices. More specifically, the present invention provides a titanium-nickel-palladium solderable metal system for silicon power semiconductor devices, which is used for one or both of the anode or cathode.

In one embodiment, the metal system broadly comprises an outer layer of palladium, an intermediate layer of nickel, and an inner layer of titanium. The thicknesses of the layers may vary depending on the needs and desires of design. In general, in the anode the palladium layer has a thickness of approximately between $2 \times 10^{-2}$ μm and $5 \times 10^{-1}$ μm, the nickel layer has a thickness of approximately between $15 \times 10^{-2}$ μm and 1.5 μm, and the titanium layer has a thickness of approximately between $5 \times 10^{-2}$ μm and $6 \times 10^{-1}$ μm. In general, in the cathode the palladium layer has a thickness of approximately between $272 \times 10^{-4}$ μm and $68 \times 10^{-2}$ μm, the nickel layer has a thickness of approximately between $204 \times 10^{-3}$ μm and 2.04 μm, and the titanium layer has a thickness of approximately between $68 \times 10^{-3}$ μm and $816 \times 10^{-3}$ μm.

In various configurations, the metal system (i.e., one or both of the anode or cathode) may further include any one or more of the following additional features. The layer of nickel may include nickel alloyed with vanadium. The metal system may be deposited on bare silicon. The metal system may be deposited on one or more additional layers of metal which may include one or more of aluminum, aluminum having approximately 1% silicon, or metal silicide.

The present invention provides a number of advantages over prior art metal systems. For example, the use of palladium avoids the high cost of gold and the corrosion tendency of silver without compromising performance. Furthermore, palladium is harder (approximately 4.75 on the Mohs scale) and less prone to scratching than gold or silver and, therefore, results in fewer wafer rejections. Additionally, where the electrodes are exposed to multiple iterations of the soldering cycle, palladium, unlike gold, will not interact with and allow the nickel to migrate to the outer surface of the metal system where it may corrode and compromise the soldered connection.

These and other features of the present invention are described in greater detail below in the section titled DETAILED DESCRIPTION OF THE INVENTION.

BRIEF DESCRIPTION OF THE DRAWING FIGURES

The present invention is described herein with reference to the following drawing figures, which are not necessarily to actual scale:

DETAILED DESCRIPTION OF THE INVENTION

With reference to the drawings figures, a metal system for power semiconductor devices is herein described, shown, and otherwise disclosed in accordance with various embodiments, including a preferred embodiment.

Figure 3:
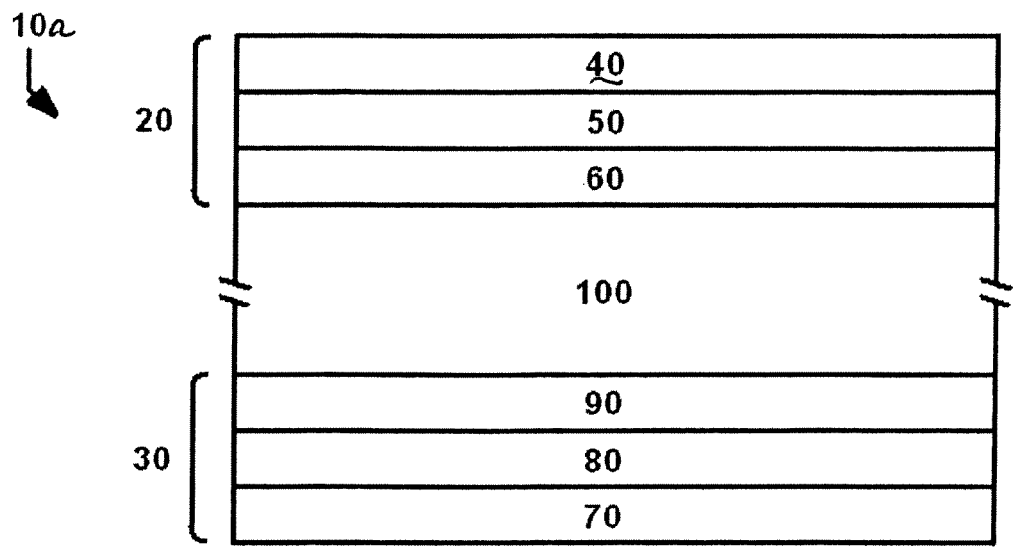
FIG. 3 is a schematic cross-sectional elevation view representation of a power semiconductor device including the top metal system of the present invention deposited on silicon.
Figure 4:
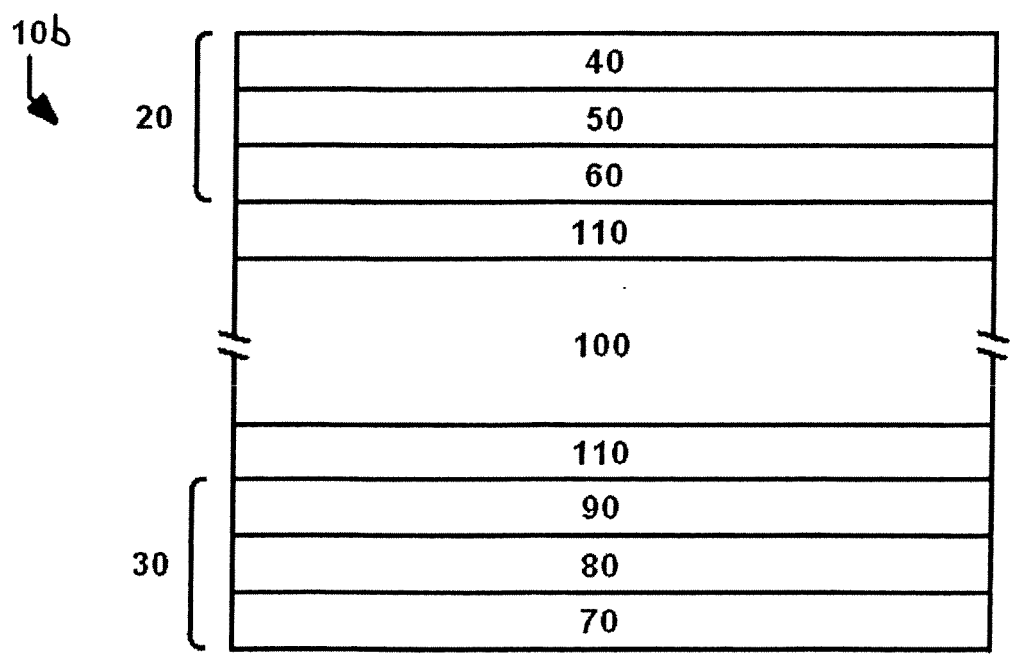
FIG. 4 is a schematic cross-sectional elevation view representation of a power semiconductor device including the top metal system of the present invention deposited on one or more additional metals.

Referring to FIGS. 3 and 4, the present invention broadly concerns a titanium-nickel-palladium solderable top metal system for a silicon power semiconductor chip 10a,10b which is subsequently packaged. In different embodiments, the chip is packaged in an axial configuration, surface-mount configuration, or another desired configuration. The metal system may be used for one or both of the anode 20 or cathode 30. As mentioned, in less typical cases the cathode is the front metal and the anode is the back metal. For consistency, the present disclosure refers to the typical case in which the anode is the front metal and the cathode is the back metal, but it shall be understood that the present invention applies equally to both the typical and atypical polarities.

Figure 1:
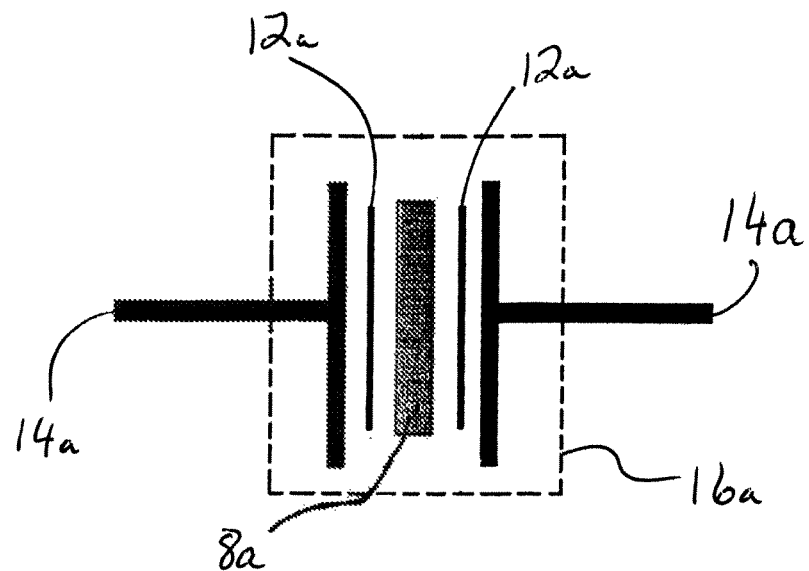
FIG. 1 is a representation of a semiconductor chip packaged in an axial configuration.
Figure 2:
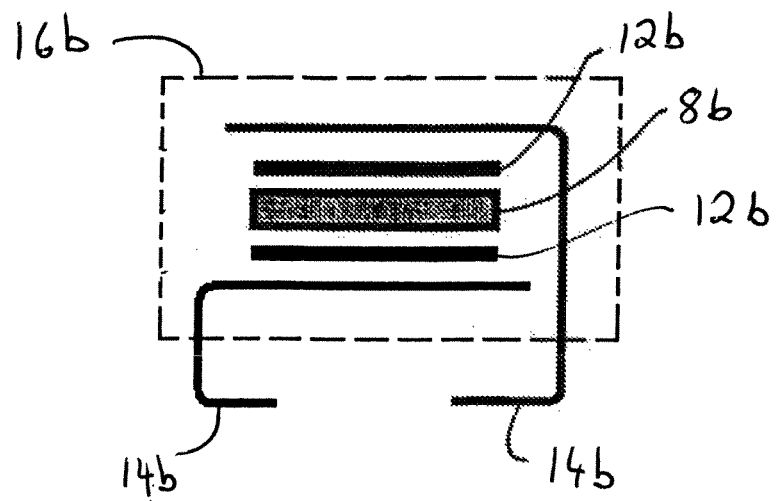
FIG. 2 is a representation of a semiconductor chip packaged in a surface-mounted configuration.

Through the process of "packaging," illustrated in FIGS. 1 and 2, both electrodes are connected to an external circuit. The objectives of packaging include connecting a die to the external circuit, removing heat generated by the device, and protecting the die from the external environment. Electrical connection can take several forms, including wire-bonded contact, but soldered connections 12a,12b to leads 14a,14b extending from plastic packages 16a,16b reduce lateral resistance, reduce hot spots, and remove heat from the chip so that it can operate at higher temperatures. A variety of different packages are used for silicon rectifier chips with solderable metal pads on both sides of the chip. Referring to FIG. 1 an exemplary semiconductor chip 8a, such as a Schottky rectifier or PN junction diode, is shown packaged in an axial configuration. Referring to FIG. 2 an exemplary semiconductor chip 8b is shown packaged in a surface-mounted configuration, such as SMA or SMB (respectively, "surface mounted A" package and "surface mounted B" package).

In a first embodiment, the top metal system comprises an outer layer of palladium, an intermediate layer of nickel, and an inner layer of titanium. With regard to the anode 20, the palladium layer 40 may have a thickness of approximately between $2 \times 10^{-2}$ μm and $5 \times 10^{-1}$ μm, or approximately between $4 \times 10^{-2}$ μm and $12 \times 10^{-2}$ μm, or approximately between $54 \times 10^{-3}$ μm and $66 \times 10^{-3}$ μm, or in one embodiment, approximately $6 \times 10^{-2}$ μm. The palladium layer protects the nickel layer from oxidation; during soldering, the palladium is dissolved in the solder. Palladium belongs to the platinum group of metals, and other metals from that group, e.g., rhodium, are in alternate embodiments, used in place of palladium. The nickel layer 50 may have a thickness of approximately between $15 \times 10^{-2}$ μm and 1.5 μm, or approximately between $17 \times 10^{-2}$ μm and 1 μm, or approximately between $198 \times 10^{-3}$ μm and $242 \times 10^{-3}$ μm, or, in one embodiment, approximately $22 \times 10^{-2}$ μm. Where the nickel layer is deposited using a sputtering process, the nickel may be alloyed with approximately 7% vanadium to suppress the magnetic properties of the nickel. Solder adheres well to nickel, and standard solders with peak temperatures below approximately 450 degrees C. do not dissolve nickel. The titanium layer 60 may have a thickness of approximately between $5 \times 10^{-2}$ μm and $6 \times 10^{-1}$ μm, or approximately between $8 \times 10^{-2}$ μm and $4 \times 10^{-1}$ μm, or approximately between $99 \times 10^{-3}$ μm and $121 \times 10^{-3}$ μm, or, in one embodiment, approximately $11 \times 10^{-2}$ μm. Titanium adheres well to silicon, and provides a "glue layer" between the silicon substrate and the nickel layer.

With regard to the cathode 30, the palladium layer 70 may have a thickness of approximately between $272 \times 10^{-4}$ μm and $68 \times 10^{-2}$ μm, or approximately between $4 \times 10^{-2}$ μm and $12 \times 10^{-2}$ μm, or between $54 \times 10^{-3}$ μm and $66 \times 10^{-3}$ μm, or, in one embodiment, approximately $6 \times 10^{-2}$ μm. As mentioned, other metals from the platinum group may be used in place of palladium. The nickel layer 80 may have a thickness of approximately between $204 \times 10^{-3}$ μm and 2.04 μm, or approximately between $2312 \times 10^{-4}$ μm and 1.36 μm, or approximately between $297 \times 10^{-3}$ μm and $363 \times 10^{-3}$ μm, or, in one embodiment, approximately $33 \times 10^{-2}$ μm. As mentioned, the nickel may be alloyed with vanadium. The titanium layer 90 may have a thickness of approximately between $68 \times 10^{-3}$ μm and $816 \times 10^{-3}$ μm, or approximately between $1088 \times 10^{-4}$ μm and $544 \times 10^{-3}$ μm, or approximately between $135 \times 10^{-3}$ μm and $165 \times 10^{-3}$ μm, or, in one embodiment, approximately $15 \times 10^{-2}$ μm.

One or both of the anode 20 or cathode 30 may be deposited directly onto the silicon surface 100 (seen in FIG. 3) or deposited onto one or more other metals 110 (seen in FIG. 4) already deposited onto the silicon surface 100. For example, a layer of metal silicide formed by salicidation on the silicon surface 100 as a primary contact provides low contact resistance and improved self-alignment with the silicon window in the dielectric overcoat. Alternatively, a layer of aluminum may be used as the primary contact with the silicon surface 100. For certain applications, the aluminum may include approximately 1% silicon. Alternatively, both metal silicide and aluminum, with or without 1% silicon, are deposited below the top metal system.

The present invention provides a number of advantages over prior art metal systems. For example, the use of palladium avoids the high cost of gold and the corrosion tendency of silver without compromising performance. The top metal system of the present invention is substantially indistinguishable from gold or silver systems with respect to wafer fabrication and packaging operations.

Furthermore, palladium is harder (approximately 4.75 on the Mohs scale) and less prone to scratching than gold or silver and, therefore, results in fewer wafer rejections. Preliminary estimates indicate a significant reduction in rejections and a corresponding significant savings in the total cost of wafer production.

Additionally, where the electrodes are exposed to multiple iterations of the soldering cycle, which is very common in the assembly of hybrid circuits, gold interacts with nickel at a relatively low temperature, which results in the nickel migrating to the outer surface of the metal system and oxidizing in atmospheres of >3 pμm of oxygen, which compromises the soldered connection. Palladium does not interact with nickel until much higher temperatures, and so avoids this disadvantage of prior art metal systems.

Additionally, where silver is used rather than nickel, a relatively thick layer (2 μm or more) of silver must be used to reduce (but not eliminate) the risk that all of the silver migrates to the melted solder during the assembly process. If complete migration occurs, then the titanium is left in direct contact with the solder, and, because titanium is not wetted by standard solders used in the semiconductor industry, this results in a bad electrical connection. Relatedly, at higher temperatures silver readily absorbs residual oxygen in the soldering chamber, and at lower temperatures the oxygen is released. The released oxygen precipitates to the interfaces of the metal layers, which degrades adhesion between the titanium and silver layers. A monolayer of titanium oxide can cause massive adhesion failure, which can occur with as little as 3 pμm of residual oxygen/moisture in the chamber. The present invention uses nickel instead of silver and so avoids these disadvantages of prior art metal systems.

Although the invention has been disclosed with reference to various particular embodiments, it is understood that equivalents may be employed and substitutions made herein without departing from the scope of the invention as recited in the claims.

Having thus described multiple embodiments of the invention, what is claimed as new and desired to be protected by Letters Patent includes the following:

1. A solderable silicon power semiconductor device including an anode deposited on a silicon substrate, and a cathode deposited on the silicon substrate, the device comprising:

the anode including:
an anode outer palladium layer having a thickness approximately between $54 \times 10^{-3}$ μm and $66 \times 10^{-3}$ μm;
an anode intermediate nickel layer having a thickness approximately between $198 \times 10^{-3}$ μm and $242 \times 10^{-3}$ μm, and
an anode inner titanium layer having a thickness approximately between $99 \times 10^{-3}$ μm and $121 \times 10^{-3}$ μm, and the cathode including:
a cathode outer palladium layer having a thickness approximately between $54 \times 10^{-3}$ μm and $66 \times 10^{-3}$ μm;

a cathode intermediate nickel layer having a thickness approximately between $297 \times 10^{-3}$ μm and $363 \times 10^{-3}$ μm, and a cathode inner titanium layer having a thickness approximately between $135 \times 10^{-3}$ μm and $165 \times 10^{-3}$ μm.

2. The solderable silicon power semiconductor device as set forth in claim 1, wherein at least one of the anode intermediate nickel layer and the cathode intermediate nickel layer includes nickel alloyed with approximately 7% vanadium.

3. A solderable silicon power semiconductor device including an anode, a cathode, and a silicon substrate, and one or more additional layers of metal interposed between the silicon substrate and at least one of the anode and the cathode, the device comprising:

the anode including:
an anode outer palladium layer having a thickness approximately between $54 \times 10^{-3}$ μm and $66 \times 10^{-3}$ μm;
an anode intermediate nickel layer having a thickness approximately between $198 \times 10^{-3}$ μm and $242 \times 10^{-3}$ μm; and
an anode inner titanium layer having a thickness approximately between $99 \times 10^{-3}$ μm and $121 \times 10^{-3}$ μm, and the cathode including:
a cathode outer palladium layer having a thickness approximately between $54 \times 10^{-3}$ μm and $66 \times 10^{-3}$ μm;
a cathode intermediate nickel layer having a thickness approximately between $297 \times 10^{-3}$ μm and $363 \times 10^{-3}$ μm, and
a cathode inner titanium layer having a thickness approximately between $135 \times 10^{-3}$ μm and $165 \times 10^{-3}$ μm.

4. The solderable silicon power semiconductor device as set forth in claim 3 wherein at least one of the anode intermediate nickel layer and the cathode intermediate nickel layer includes nickel alloyed with approximately 7% vanadium.

5. The solderable silicon power semiconductor device as set forth in claim 3, wherein the one or more additional layers of metal include aluminum.

6. The solderable silicon power semiconductor device as set forth in claim 3, wherein the one or more additional layers of metal include aluminum having approximately 1% silicon.

7. The solderable silicon power semiconductor device as set forth in claim 3, wherein the one or more additional layers of metal include metal silicide.

8. The solderable silicon power semiconductor device as set forth in claim 3, wherein the one or more additional layers of metal include metal silicide and aluminum.

9. The solderable silicon power semiconductor device as set forth in claim 3, wherein the one or more additional layers of metal include metal silicide and aluminum having approximately 1% silicon.

* * * * *